United States Patent [19]

Kriedt et al.

[11] Patent Number: 5,041,889
[45] Date of Patent: Aug. 20, 1991

[54] MONOLITHICALLY INTEGRATABLE TRANSISTOR CIRCUIT FOR LIMITING TRANSIENT POSITIVE HIGH VOLTAGES, SUCH AS ESD PULSES CAUSED BY ELECTROSTATIC DISCHARGES ON ELECTRIC CONDUCTORS

[75] Inventors: Hans Kriedt; Heinz Zietemann, both of Munich, Fed. Rep. of Germany

[73] Assignee: Siemens Aktiengesellschaft, Munich, Fed. Rep. of Germany

[21] Appl. No.: 494,221

[22] Filed: Mar. 15, 1990

[30] Foreign Application Priority Data

Mar. 16, 1989 [EP] European Pat. Off. ........ 89104711.0

[51] Int. Cl.⁵ .............................................. H01L 27/02
[52] U.S. Cl. .............................. 357/23.13; 357/23.11; 357/34; 357/51; 307/542; 361/91
[58] Field of Search .................. 357/23.13, 34, 51; 307/542; 361/56, 91

[56] References Cited

U.S. PATENT DOCUMENTS

| 3,270,289 | 8/1966 | Citrin ................................. 307/542 |
| 4,271,445 | 6/1981 | Hartman et al. . |
| 4,302,792 | 1/1981 | Harwood . |
| 4,631,567 | 12/1986 | Kokado et al. .................. 357/23.13 |

FOREIGN PATENT DOCUMENTS

| 2654419 | 6/1978 | Fed. Rep. of Germany . |
| 3125198 | 3/1982 | Fed. Rep. of Germany . |
| 3301800 | 8/1984 | Fed. Rep. of Germany . |
| 8319040 | 5/1985 | France . |
| 55-146963 | 11/1980 | Japan ............................... 357/23.13 |
| 55-165682 | 12/1980 | Japan ............................... 357/23.13 |
| 56-40279 | 4/1981 | Japan ............................... 357/23.13 |
| 58-97867 | 6/1983 | Japan ............................... 357/23.13 |

OTHER PUBLICATIONS

IBM Technical Disclosure Bulletin 30 (1988) Jan., No. 8, NY, U.S.A., vol. 30 "Cascaded Electrostatic Discharge Protection Structure", pp. 389, 390.

Primary Examiner—Andrew J. James
Assistant Examiner—Ngan Van Ngo
Attorney, Agent, or Firm—Herbert L. Lerner; Laurence A. Greenberg

[57] ABSTRACT

A monolithically integratable transistor circuit for limiting transient positive high voltages on an electric conductor includes a pnp transistor being conductive only upon exceeding a predetermined potential threshold value being positive as compared with a reference potential. The pnp transistor has an emitter terminal connected to an electric conductor, a collector terminal connected to the reference potential, and a base terminal. A parallel circuit is connected between the base terminal and the electric conductor. The parallel circuit has a high-impedance resistor and a first capacitor. A second capacitor is connected between the base terminal and the reference potential.

8 Claims, 1 Drawing Sheet

MONOLITHICALLY INTEGRATABLE TRANSISTOR CIRCUIT FOR LIMITING TRANSIENT POSITIVE HIGH VOLTAGES, SUCH AS ESD PULSES CAUSED BY ELECTROSTATIC DISCHARGES ON ELECTRIC CONDUCTORS

BACKGROUND OF THE INVENTION

The invention relates to a monolithically integratable transistor circuit for limiting transient positive high voltages on an electric conductor, including a pnp transistor having an emitter terminal connected to the electric conductor and a collector terminal connected to a reference potential, the pnp transistor being conductive only upon exceeding a predetermined potential threshold value being positive as compared with the reference potential. The invention also relates to semiconductor structures for simple attainment of such transistor circuits.

German Published, Non-Prosecuted Application DE-OS No. 26 54 419 discloses circuit configurations for voltage limitation on electric conductors, in which a controllable path of a semiconductor array, in particular the collector-to-emitter path of a transistor, is disposed between the conductor to be protected and reference potential. From the control input of the semiconductor array, diode chains are connected in the blocking direction with respect to the conductor to be protected and to reference potential, respectively. In order to provide protection against positive high voltages on the conductor to be protected, the corresponding diode chain is connected in the conducting direction from the conductor to be protected to the control input of the semiconductor array. The number of diodes determines the maximum allowable voltage. However, in integrated circuits such diode chains should be avoided if at all possible, because they require so much surface area. Furthermore, the voltage value at which the voltage limitation is supposed to be initiated is only imprecisely defined, and the impedance with which such a circuit loads the conductor to be protected is subject to relatively major variation, and considerably limits the processable signal frequency.

German Published, Non-Prosecuted Application DE-OS No. 31 25 198, in particular FIG. 3 thereof, discloses a transistor protection circuit for protecting electric conductors against transient positive high voltages, in which the emitter of a pnp transistor is connected to the conductor to be protected, the collector of the pnp transistor is connected to the reference potential, and the base terminal of the pnp transistor is connected to the reference potential through a diode in the conducting direction and is acted upon by a reference bias voltage. If, for instance, the conductor to be protected is connected to a bus or port of a data system, then it is possible for both signal voltages and ESD pulses to appear on the conductor even if the semiconductor circuit to be protected, including the transistor protection circuit, is not in operation. However, in such a case, a transistor protection circuit of the kind known from German Published, Non-Prosecuted Application DE-OS No. 31 25 198, would also not be in operation, because no reference bias voltage is present.

The use of substrate diodes is a proven way to protect electric conductors against transient negative high voltages. A protective circuit known from German Published, Non-Prosecuted Application DE-OS No. 33 01 800 for protecting against negative high voltages has better high-frequency properties.

SUMMARY

It is accordingly an object of the invention to provide a monolithically integratable transistor circuit for limiting transient positive high voltages, such as ESD pulses caused by electrostatic discharges on electric conductors, which overcomes the hereinafore-mentioned disadvantages of the heretofore-known devices of this general type which is simple to manufacture and which functions independently the presence of a supply voltage.

With the foregoing and other objects in view there is provided, in accordance with the invention, a monolithically integratable transistor circuit for limiting transient positive high voltages on an electric conductor, comprising a pnp transistor being conductive only upon exceeding a predetermined potential threshold value being positive as compared with a reference potential, the pnp transistor having an emitter terminal connected to an electric conductor, a collector terminal connected to the reference potential, and a base terminal, a parallel circuit connected between the base terminal and the electric conductor, the parallel circuit having a high-impedance resistor and a first capacitor, and a second capacitor connected between the base terminal and the reference potential.

In accordance with another feature of the invention, the second capacitor is a depletion layer capacitance of a pn-junction.

In accordance with a further feature of the invention, the first capacitor is a plate capacitor formed of the electric conductor, an insulation layer and a semiconductor layer.

In accordance with an added feature of the invention, the pnp transistor is formed by a p-doped substrate acted upon by the reference potential, an n-doped epitaxial trough disposed on the substrate, and a defined p-doped zone formed in the epitaxial trough and connected to the conductor.

In accordance with an additional feature of the invention, the epitaxial layer provides resistor material for forming the high-impedance resistor.

In accordance with a concomitant feature of the invention, the pnp transistor is a vertical pnp transistor having a zone being active as the base of the vertical pnp transistor, the conductor contacts the epitaxial layer at a contact or bonding location being limited in areal extension, the contact location is spaced a given distance from the zone of the epitaxial layer being active as the base of the vertical pnp transistor, and the epitaxial layer between the contact location and the zone of the epitaxial layer being active as the base of the vertical pnp transistor forms the high-impedance resistor.

Other features which are considered as characteristic for the invention are set forth in the appended claims.

Although the invention is illustrated and described herein as embodied in a monolithically integratable transistor circuit for limiting transient positive high voltages, such as ESD pulses caused by electrostatic discharges on electric conductors, it is nevertheless not intended to be limited to the details shown, since various modifications and structural changes may be made therein without departing from the spirit of the invention and within the scope and range of equivalents of the claims.

BRIEF DESCRIPTION OF THE DRAWINGS

The construction and method of operation of the invention, however, together with additional objects and advantages thereof will be best understood from the following description of specific embodiments when read in connection with the accompanying drawings.

DESCRIPTION OF THE PREFERED EMBODIMENTS

Figure 1:
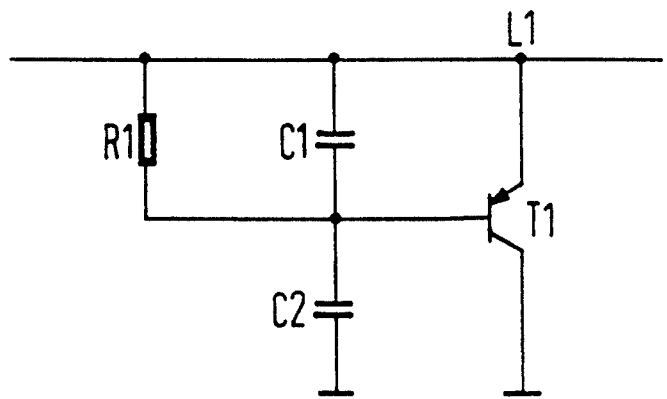
FIG. 1 is a schematic circuit diagram of an exemplary embodiment of a transistor circuit according to the invention.

Referring now to the figures of the drawing in detail and first, particularly, to FIG. 1 thereof, there is seen a conductor L1, which is connected to the emitter of a pnp transistor T1 as well as to one terminal of a first capacitor C1 and to one terminal of a resistor R1, particularly a high-impedance resistor. The other terminal of the resistor R1 and the other terminal of the capacitor C1 are both connected to the base terminal of the pnp transistor T1 and are connected to reference potential through a second capacitor C2. The collector of the pnp transistor T1 is also connected to the reference potential. If the conductor L1 is acted upon by a conventional signal, then a mean voltage level of the signal is applied through the high-impedance resistor R1 to the base terminal of the pnp transistor T1. The first capacitor C1 and the second capacitor C2 form a capacitive voltage divider between the conductor L1 and the reference potential, i.e., ground. A rapid change in voltage on the conductor L1 leads to a proportional change in voltage at the base terminal of the pnp transistor T1, as a function of the ratio of the two capacitances of the capacitors C1, C2. If a positive ESD pulse is emitted to the contact spot or location, then the voltage is distributed according to the capacitance ratio C1/C2. If a voltage drop takes place across the capacitor C1 in this process that is greater than the threshold voltage of the pnp transistor T1, then the pnp transistor T1 is made conducting and the voltage level on the conductor L1 is thus limited. The resistor R1 should be selected in such a way that a blocking current that may be established, which may be dictated in particular by the capacitor C2 or by some other semiconductor structure, can be eliminated so reliably that the pnp transistor P1 does not become conducting during normal operation, in other words in the absence of a high voltage to be limited.

The parasitic capacity with which the conductor L1 is loaded, and which is due to the transistor circuits for limiting transient positive high voltages, among other factors, should be kept as constant as possible and as low as possible, particularly if high-frequency signals are to be transmitted with the aid of the conductor L1. If the resistor R1 is selected appropriately, then it assures that the voltage specified at the conductor L1 will be present at the base of the pnp transistor and thus at the second capacitor C2. If the second capacitor C2 is constructed in the form of a depletion layer capacitor, then an increase in the voltage in the conductor L1 causes an increase in the depletion voltage and thus a reduction in the capacitance of the second capacitor C2. In that case, in the presence of a signal having a level which is positive as compared with the reference potential, the conductor L1 is not as highly loaded capacitively as it is in the absence of a signal. The parasitic capacitive load of the conductor L1 by a transistor circuit according to the invention for limiting transient positive high voltage, is substantially composed in normal operation of the parallel circuit of the emitter-to-collector capacitance of the blocked pnp transistor T1 and a capacitive series circuit, formed of the first capacitor C1 and the second capacitor C2. Accordingly, given a suitable selection of the capacitances, variations in the second capacitor C2 do not cause excessively great fluctuations in the parasitic capacitive load of the conductor L1.

The inverse of the time constant that results from the parallel circuit of the capacitors C1 and C2 and of the resistor R1 should be notably below the useful frequency transmitted over the conductor L1. In the case of relatively rapidly rising high-voltage signals, such as so-called transients or EMD pulses, the time constant of the parallel circuit is not definitive because, given a suitable selection of the capacitances C1 and C2, these variations are transmitted to the base of the pnp transistor T1 through the series circuit of the capacitors C1 and C2, which are connected as a capacitive voltage divider, and make the pnp transistor conducting.

Typically, electric conductors such as conductor tracks or contact locations or spots in monolithically integrated circuits are separated from a conductive semiconductor layer by an insulation layer. For instance, an oxide film, plasma nitride film or a polyimide film may be used. Such a configuration produces a plate capacitor having one electrode which forms the conductor track, or contact spot or location, which results in a higher capacitance because of its larger surface area, and the other electrode forms the semiconductor layer located below it, while the dielectric is formed by the insulation layer.

The heat arising in bonding, and the resultant pressure, can cause separations or cracks to form in the substrate underneath contact spots or locations that are only separated from the substrate by an insulation layer. In order to prevent this, epitaxial troughs or pits are typically provided, particularly underneath the contact locations or spots of monolithically integrated circuits.

If the contact spot or location is provided in order to construct the first capacitor C1 as a capacitor electrode on the side of a conductor L1 to be protected, and if an epitaxial layer EPI forming a trough is provided as the second capacitor electrode, which is separated from the contact location or spot by an insulation layer OXI and is limited in its lateral extension by an insulation frame IFR being formed of highly doped semiconductor material or semiconductor oxide, then the capacitance of the resultant capacitor can be properly adjusted as a function of the material and thickness of the dielectric OXI and of the size of the active surface between the contact location or spot and the epitaxial trough.

In order to make the resistor R1, a doped semiconductor material can be used, such as the normally weakly doped semiconductor material of an epitaxial trough EPI, taking the appropriate geometric conditions and the doping into account. In order to provide bonding between an n-doped epitaxial trough EPI and a conductor separated from it by an insulating layer OXI, and to avoid a possible parasitic Schottky diode, it is normal to partially interrupt the insulating layer OXI and to incorporate a spatially limited, more highly doped zone N+ of the same conduction type in the resultant bonding or contact zone. In order to provide easier adjustment of the resistance, the epitaxial layer EPI, which forms the epitaxial trough disposed underneath the contact location or spot, can be extended in the form of a channel CH, while the point where contact is made between the conductor L1 and the epitaxial layer EPI is located as far away as possible from the epitaxial trough, and the resistance can be adjusted as a function of the specific resistance of the epitaxial layer EPI, the cross section of the channel CH, and the length of the channel CH, or the location of the aforementioned point of contact N+ between the conductor L1 and the epitaxial layer EPI. The substrate SUB is typically at reference potential in semiconductor circuits. Thus with an n-doped epitaxial trough EPI applied to a p substrate, a pn-junction is brought about from the reference potential to the epitaxial layer EPI. A depletion layer is thus present between the epitaxial layer EPI and the substrate SUB, with its depletion layer capacitance dependent on the depletion voltage. The epitaxial trough EPI and the insulating frame IFR limiting it laterally, also form a capacitor. Consequently, an n-doped epitaxial trough EPI together with the p substrate SUB and the insulating frame IFR, forms a capacitance counter to the reference potential that can be considered as a second capacitor C2 in accordance with the invention.

Figure 2:
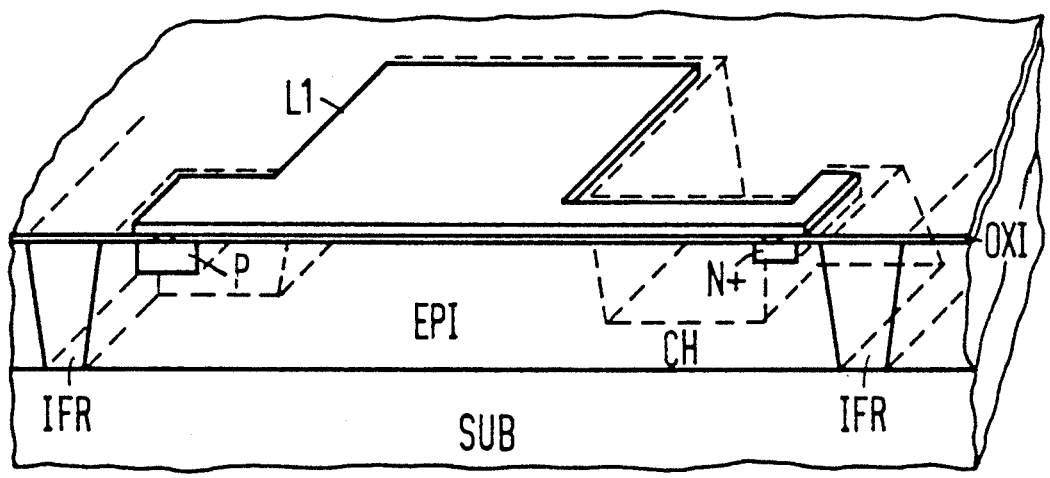
FIG. 2 is a fragmentary, diagrammatic, perspective view of a simple practical realization of a transistor circuit according to the invention.

FIG. 2 shows a particularly favorable embodiment of a transistor circuit according to the invention.

The conductor L1, which is a conductive layer, forms a contact location or spot with a relatively large surface area as well as narrower conductor tracks. In FIG. 2, only the elements required for a transistor circuit according to the invention are shown. An insulating layer OXI separates the conductor L1 from an epitaxial trough EPI, which in particular is n-doped. The epitaxial layer EPI is disposed on a semiconductor substrate SUB, in particular a p-doped substrate, and is insulated laterally by an insulating frame IFR. The insulating layer OXI is interrupted at two points, which are not located in the immediate vicinity of the contact location or spot and therefore are not as heavily loaded in terms of temperature and pressure in a bonding operation. In the vicinity of one interruption of the insulating layer OXI, a defined zone P of the same conduction type as the substrate SUB is doped, and disposed in such a way that it is bonded to both the conductor L1 and the epitaxial layer EPI. The zone P forms the emitter of a pnp transistor in a circuit according to the invention. In the vicinity of the other interruption of the insulating layer OXI, which is disposed on the end opposite the contact location or spot of a channel CH formed by the epitaxial trough EPI, a defined zone N+ of the same conduction type as the epitaxial layer EPI, but doped considerably more highly than the epitaxial layer, is provided and disposed in such a way that it is bonded to both the conductor L1 and the epitaxial layer EPI. This highly doped zone provides good, defined contact between the epitaxial layer EPI and the conductor L1. As already described, the conductor L1, with the insulating layer OXI as a dielectric and with the epitaxial layer EPI, forms the first capacitor C1 of a circuit according to the invention. The defined zone P forms the pnp transistor T1 with the substrate SUB and the epitaxial layer EPI. The epitaxial layer forms the resistor R1, particularly in the laterally limited channel CH, and the depletion layer capacitance between the epitaxial layer EPI and the substrate SUB or the insulating frame IFR serves to provide the second capacitor C2.

A particularly favorable feature of this kind of embodiment of a transistor circuit according to the invention is that hardly any additional chip surface area is needed, and the capacitance and resistance can be adjusted with the required accuracy.

We claim:

1. Monolithically integratable transistor circuit for limiting transient positive high voltages on an electric conductor, comprising a pnp transistor being conductive only upon exceeding a predetermined potential threshold value being positive as compared with a reference potential, said pnp transistor having an emitter terminal connected to an electric conductor, a collector terminal connected to the reference potential, and a base terminal, a parallel circuit connected between the base terminal and the electric conductor, said parallel circuit having a high-impedance resistor and a first capacitor, and a second capacitor connected between the base terminal and the reference potential.

2. Transistor circuit according to claim 1, wherein said second capacitor is a depletion layer capacitance of a pn-junction.

3. Transistor circuit according to claim 1, wherein said first capacitor is a plate capacitor formed of the electric conductor, an insulation layer and a semiconductor layer.

4. Transistor circuit according to claim 2, wherein said first capacitor is a plate capacitor formed of the electric conductor, an insulation layer and a semiconductor layer.

5. Transistor circuit according to claim 1, wherein said pnp transistor is formed by a p-doped substrate acted upon by the reference potential, an n-doped epitaxial trough disposed on said substrate, and a defined p-doped zone formed in said epitaxial trough and connected to the conductor.

6. Transistor circuit according to claim 5, wherein said epitaxial layer provides resistor material for forming said high-impedance resistor.

7. Transistor circuit according to claim 6, wherein said pnp transistor is a vertical pnp transistor having a zone being active as the base of said vertical pnp transistor, the conductor contacts said epitaxial layer at a contact location, said contact location is spaced a given distance from said zone of said epitaxial layer being active as the base of said vertical pnp transistor, and said epitaxial layer between said contact location and said zone of said epitaxial layer being active as the base of said vertical pnp transistor forms said high-impedance resistor.

8. Monolithically integratable transistor circuit for limiting transient voltages on an electric conductor, comprising a transistor having an emitter terminal connected to an electric conductor, a collector terminal connected to a reference potential, and a base terminal, a parallel circuit connected between the base terminal and the electric conductor, said parallel circuit having a high-impedance resistor and a first capacitor, and a second capacitor connected between the base terminal and the reference potential.

* * * * *